United States Patent
Li et al.

(10) Patent No.: US 10,203,543 B2
(45) Date of Patent: Feb. 12, 2019

(54) COLOR FILM SUBSTRATE AND MANUFACTURING METHOD THEREOF, DISPLAY PANEL, DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Ning Li, Beijing (CN); Xiaona Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/527,911

(22) PCT Filed: May 11, 2016

(86) PCT No.: PCT/CN2016/081672
§ 371 (c)(1),
(2) Date: May 18, 2017

(87) PCT Pub. No.: WO2017/140043
PCT Pub. Date: Aug. 24, 2017

(65) Prior Publication Data
US 2018/0107055 A1   Apr. 19, 2018

(30) Foreign Application Priority Data

Feb. 18, 2016   (CN) .......................... 2016 1 0091328

(51) Int. Cl.
*G02F 1/1335*   (2006.01)
*G03F 7/00*   (2006.01)
(Continued)

(52) U.S. Cl.
CPC ...... *G02F 1/133516* (2013.01); *G02F 1/1337* (2013.01); *G02F 1/133512* (2013.01);
(Continued)

(58) Field of Classification Search
CPC ....... G03F 7/0007; G02B 5/201; G02B 5/223; G02F 1/1335; G02F 1/133512;
(Continued)

(56) References Cited

U.S. PATENT DOCUMENTS

| 5,045,418 A | 9/1991 | Fukuyoshi |
| 5,850,271 A | 12/1998 | Kim et al. |

(Continued)

FOREIGN PATENT DOCUMENTS

| CN | 1790118 A | 6/2006 |
| CN | 1828350 A | 9/2006 |

(Continued)

OTHER PUBLICATIONS

Computer-generated translation of KR 2003-0008269 (Jan. 2003). (Year: 2003).*

(Continued)

*Primary Examiner* — John A McPherson
(74) *Attorney, Agent, or Firm* — Womble Bond Dickinson (US) LLP

(57) ABSTRACT

The present disclosure discloses a color film substrate that can restrain light leakage and a manufacturing method thereof, as well as a display panel comprising said color film substrate and a display device comprising said display panel. The color film substrate comprises: a base substrate; a color filter layer formed on the base substrate, comprising a plurality of adjacently arranged filters; a protective layer formed on the color filter layer; an alignment layer formed on the protective layer, wherein the color film substrate further comprises a light shielding layer formed at positions on the alignment layer corresponding to peripheral areas of the filters.

16 Claims, 7 Drawing Sheets

(51) Int. Cl.
*G02F 1/1337* (2006.01)
*G02F 1/1339* (2006.01)

(52) U.S. Cl.
CPC ........ *G03F 7/0007* (2013.01); *G02F 1/13394* (2013.01); *G02F 2201/50* (2013.01); *G02F 2202/02* (2013.01)

(58) Field of Classification Search
CPC ......... G02F 1/133514; G02F 1/133516; G02F 1/1337; G02F 2001/133796; G02F 1/133776; G02F 1/133707; G02F 2001/133519
USPC .............................. 349/106, 110, 123; 430/7
See application file for complete search history.

(56) References Cited

U.S. PATENT DOCUMENTS

| | | | |
|---|---|---|---|
| 6,203,950 | B1 | 3/2001 | Kamamori et al. |
| 2002/0130992 | A1 | 9/2002 | Huang |
| 2017/0261818 | A1 | 9/2017 | Lan et al. |

FOREIGN PATENT DOCUMENTS

| | | | |
|---|---|---|---|
| CN | 101007949 A | | 8/2007 |
| CN | 101148591 A | | 3/2008 |
| CN | 101225308 A | | 7/2008 |
| CN | 102286133 A | | 12/2011 |
| CN | 103941462 A | | 7/2014 |
| CN | 105158984 A | | 12/2015 |
| CN | 105527747 A | | 4/2016 |
| JP | H01138530 A | | 5/1989 |
| JP | 2010-175918 A | | 8/2010 |
| KR | 2003-008269 A | * | 1/2003 |

OTHER PUBLICATIONS

International Search Report with English language translation, dated Nov. 11, 2016, International Application No. PCT/CN2016/081672 ( 14 Pages).

Office Action received for Chinese Patent Application No. 201610091328.8, dated Mar. 30, 2018, 17 pages (9 pages of English Translation and 8 pages of Office Action).

Office Action received for Chinese Patent Application No. 201610091328.8, dated on Dec. 3, 2018, 20 pages. (10 pages of English Translation and 10 pages of Office Action).

* cited by examiner

COLOR FILM SUBSTRATE AND MANUFACTURING METHOD THEREOF, DISPLAY PANEL, DISPLAY DEVICE

RELATED APPLICATIONS

The present application is the U.S. national phase entry of PCT/CN2016/081672, with an international filing date of May 11, 2016, which claims the benefit of Chinese Patent Application No. 201610091328.8, filed on Feb. 18, 2016, the entire disclosures of which are incorporated herein by reference.

FIELD

Embodiments of the present invention relate to the liquid crystal display technology, particularly to a color film substrate that can restrain light leakage and a manufacturing method thereof, as well as a display panel comprising said color film substrate and a display device comprising said display panel.

BACKGROUND

Owing to the advantages of ultra-thin plane, energy saving, low radiation and soft picture and the like, the liquid crystal display has become a mainstream display device at present. As the core component of the liquid crystal display, the display panel comprises a color film substrate and a thin film transistor (TFT) cell that is aligned and bonded with the color film substrate together. The color film substrate generally comprises a base substrate, a black matrix, a color filter layer and a protective layer, etc., the manufacturing process thereof is manufacturing the black matrix on the base substrate firstly, then manufacturing the color filter layer of three primary colors of red, green and blue having light transmittance on the black matrix, and then coating a smooth protective layer on the color filter layer.

The main function of the black matrix is to prevent light leakage between the pixels and increase the contrast of the colors. The material for forming the black matrix is generally divided into two types, i.e., metal thin layer (e.g., oxide layer) and resin thin layer (e.g., black light resistor thin layer, with carbon black as the main material) respectively.

However, the step of forming the black matrix on the base substrate requires complex processes, and the process control is complex, thereby being unfavorable for increasing the yield of the liquid crystal panel. Although various ways have been tried to solve this problem in the industry, the effect is little. Moreover, it also results in obvious increase of the manufacturing cost. Therefore, how to eliminate or restrain light leakage of the display panel at a low cost has become a thorny problem that troubles the industry.

SUMMARY

An object of an embodiment of the present invention is to provide a color film substrate, which has the advantages of a good light leakage restraining effect and a low manufacturing cost.

The color film substrate according to an embodiment of the present invention comprises:
a base substrate;
a color filter layer formed on the base substrate, comprising a plurality of adjacently arranged filters;
a protective layer formed on the color filter layer;
an alignment layer formed on the protective layer,
wherein the color film substrate further comprises a light shielding layer formed at positions on the alignment layer corresponding to peripheral areas of the filters.

For example, in the above color film substrate, the light shielding layer corresponding to the peripheral areas of the adjacent filters is formed integrally.

For example, in the above color film substrate, a material of the light shielding layer comprises liquid crystal body, monomer and photo initiator.

For example, in the above color film substrate, the monomer comprises a mixture of hexadecyl methacrylate and methyl methacrylate with a mole ratio of 1:1.

For example, in the above color film substrate, the photo initiator is azobisisobutyronitrile.

Another object of an embodiment of the present invention is to provide a liquid crystal display panel, which has the advantages of a good light leakage restraining effect and a low manufacturing cost.

The liquid crystal display panel according to an embodiment of the present invention comprises:
the color film substrate as stated above.

A further object of an embodiment of the present invention is to provide a display device, which has the advantages of a good light leakage restraining effect and a low manufacturing cost.

The display device according to an embodiment of the present invention comprises the liquid crystal display panel as stated above.

A further object of an embodiment of the present invention is to provide a manufacturing method of a color film substrate, which has the advantages of a good light leakage restraining effect and a low manufacturing cost.

The manufacturing method of a color film substrate according to an embodiment of the present invention comprises steps of:
forming a color filter layer comprising a plurality of filters on a base substrate;
forming a protective layer on the color filter layer;
forming an alignment layer on the protective layer;
forming a light shielding layer at positions on the alignment layer corresponding to peripheral areas of the filters.

For example, in the above method, in the step of forming the light shielding layer, the light shielding layer corresponding to the peripheral areas of the adjacent filters is formed integrally.

For example, in the above method, the step of forming the light shielding layer on the alignment layer comprises:
coating a light shielding material on the alignment layer;
covering the light shielding material with a mask plate, the mask plate having a pattern corresponding to the peripheral areas of the filters;
irradiating the mask plate using UV light, so as to enable the light shielding material at the positions corresponding to the peripheral areas of the filters to be cured; and
removing the uncured light shielding material.

For example, in the above method, prior to coating the light shielding material on the alignment layer, a rubbing process is performed to a surface of the alignment layer.

For example, in the above method, in the step of irradiating the mask plate using UV light, an irradiation time of the UV light is 30 minutes, and an intensity of light is 4 mw/cm$^2$.

BRIEF DESCRIPTION OF THE DRAWINGS

The above and/or other aspects and advantages of the present invention will become clearer and easier to understand through the following description of various aspects with reference to the drawings. The same or similar units in the drawings are represented by the same reference sign, the drawings include:

FIGS. 4A-4F show schematic views of the forming steps of a color filter layer, wherein FIGS. 4A and 4B show the forming process of a red filter, FIGS. 4C and 4D show the forming process of a green filter, and FIGS. 4E and 4F show the forming process of a blue filter.

DETAILED DESCRIPTION

Next, the present invention will be explained more comprehensively with reference to the drawings which illustrate the schematic embodiments of the present invention. However, the present invention can be carried out in different forms, and should not be interpreted as being only limited to the embodiments given in this text. The embodiments given above aim to enabling the disclosure of this text to be comprehensive and complete, so as to communicate the protection scope of the present invention to the skilled person in the art more comprehensively.

The workings such as "comprise" and "include" indicate, in addition to having units and steps that are directly and explicitly stated in the description and claims, that the technical solution of the present invention also does not exclude the case of having other units and steps that are not directly or explicitly stated.

The wordings such as "first' and "second" do not indicate the sequence of the units in terms of time, space, size, but only used for distinguishing the units.

The wordings such as "wherein one unit is on the other unit" or "wherein one unit is above the other unit" should be understood generally that the previous unit is located above the latter unit directly or the previous unit is located on the latter unit via a third unit.

Next, the embodiments for implementing the present invention will be described by means of the drawings.

Figure 1:
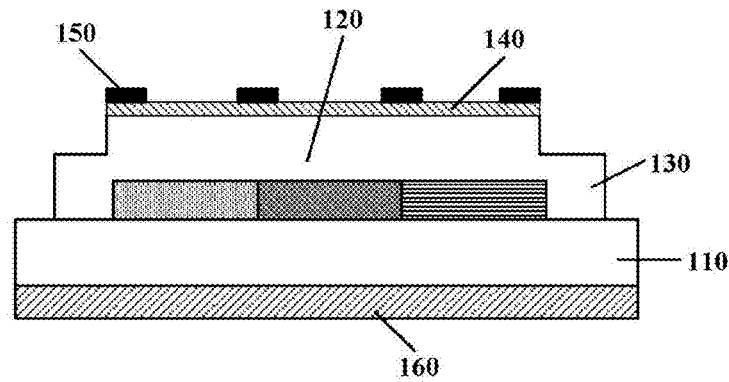
FIG. 1 is a schematic view of a color film substrate according to an embodiment of the present invention.

FIG. 1 is a schematic view of a color film substrate according to an embodiment of the present invention. The color film substrate 10 as shown in FIG. 1 comprises a base substrate 110, a color filter layer 120, a protective layer 130, an alignment layer 140, a light shielding layer 150 and an indium tin oxide (ITO) layer 160.

As shown in FIG. 1, the color filter layer 120 and the ITO layer 160 are formed on two opposite surfaces of the base substrate 110 respectively. The ITO layer 160 formed is used for shielding interference to the color film substrate 10 by electromagnetic radiation. The color filter layer 120 comprises multiple groups of filters, and each group of filters corresponds to one pixel and comprises filters of three primary colors of red, green, and blue having light transmittance (which are represented by three rectangular blocks with shadow lines exemplarily in FIG. 1). In this embodiment, the color filters are arranged adjacently. The protective layer 130 and the alignment layer 140 are formed successively on the color filter layer 120. In this embodiment, the patterned light shielding layer 150 is formed at positions on the alignment layer 140 corresponding to peripheral areas of the filters, so as to prevent light leakage between the filters. For example, the light shielding layer corresponding to the peripheral areas of adjacent filters is formed integrally.

It should be noted that the peripheral areas of the above filters are located within the areas of the filters, i.e., the edge area of the filters, rather than an area adjacent to the filter area.

The material for manufacturing the light shielding layer comprises liquid crystal body, monomer and photo initiator. In this embodiment, the liquid crystal body for example uses the same material as the liquid crystal layer so as to improve process universality. The monomer for example comprises a mixture of hexadecyl methacrylate and methyl methacrylate (MMA) with a mole ratio of 1:1. As for the optical initiator, it for example comprises azobisisobutyronitrile (AIBN).

Compared to the prior art, the color film substrate according to this embodiment uses the light shielding layer formed above the color filter layer to replace the black matrix. Because the manufacturing process of the light shielding layer is relatively simple and the controllability of the process is higher, the product yield is maintained at a relatively high level at a relatively low manufacturing cost.

Figure 2:
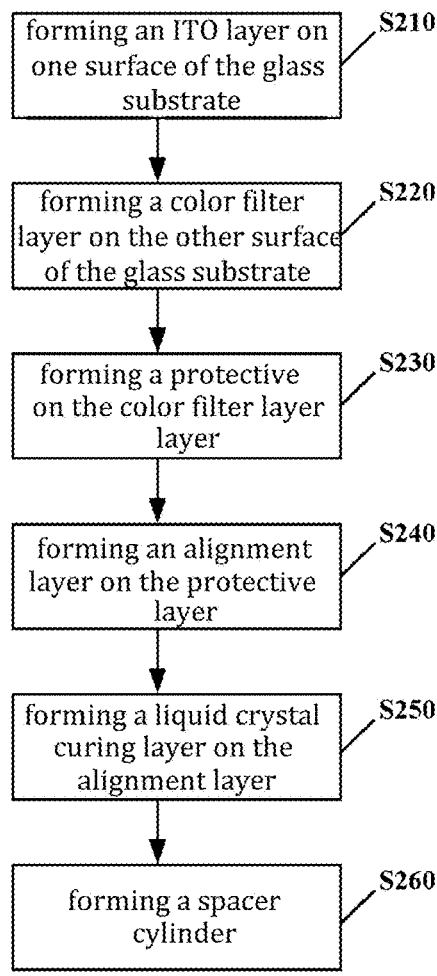
FIG. 2 is a flow chart of a method for manufacturing a color film substrate according to another embodiment of the present invention.

FIG. 2 is a flow chart of a method for manufacturing a color film substrate according to another embodiment of the present invention.

Figure 3:
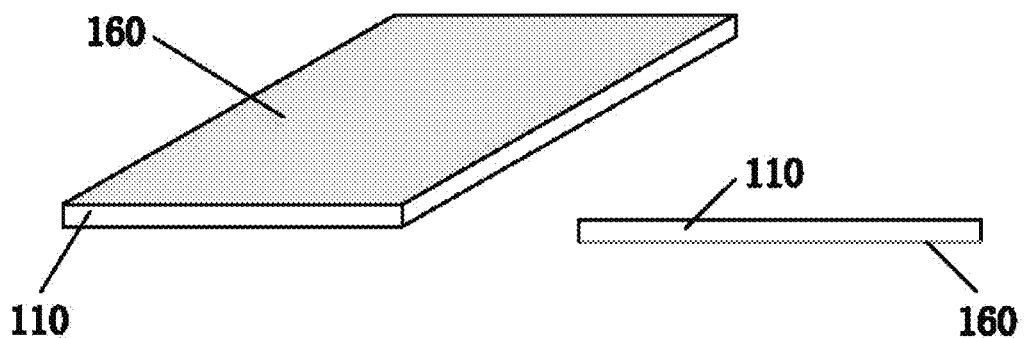
FIG. 3 shows a schematic view of a perspective view and a sectional view of a base substrate on a surface of which an ITO film is formed.

In step S210 as shown in FIG. 2, the ITO film 160 is formed on one surface of the base substrate 110, as shown in FIG. 3. In this embodiment, the manufacturing method of the ITO film for example includes but not limited to low voltage sputtering process, DC magnetron sputtering process, high density arc plasma (HDAP) approach, etc.

Figure 4A:
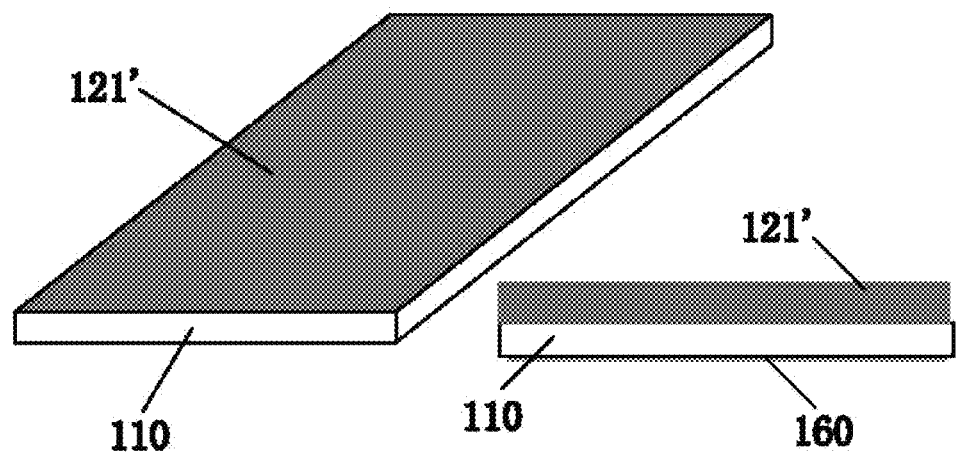
Figure 4B:
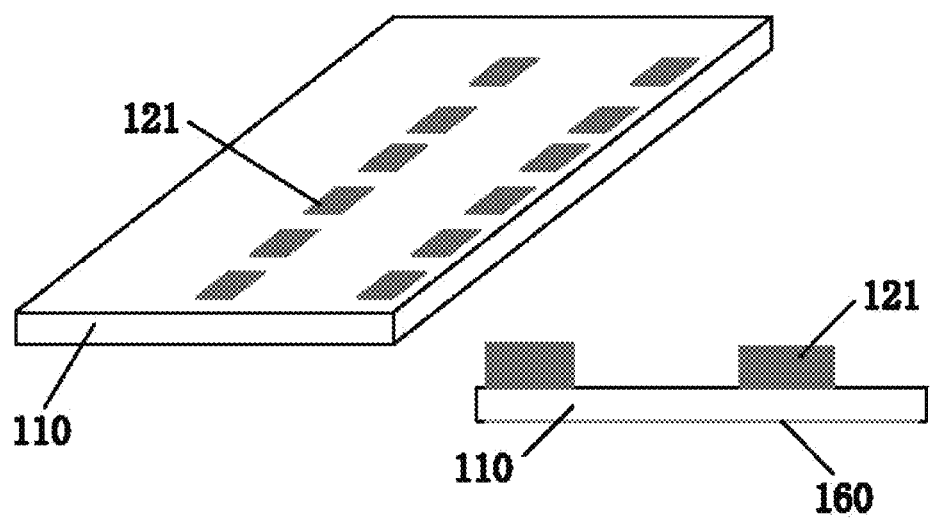
Figure 4C:
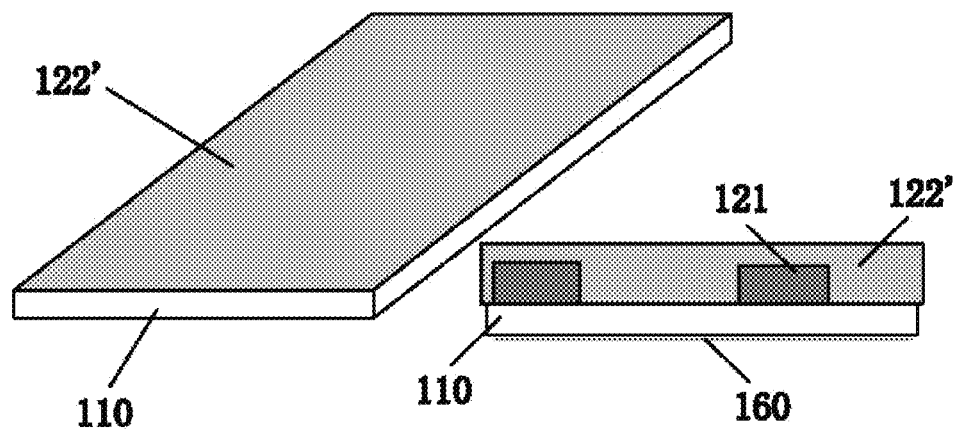
Figure 4D:
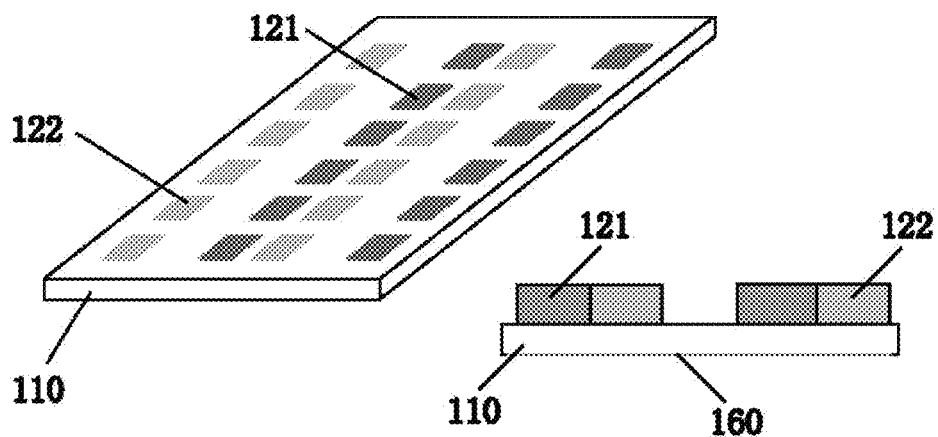
Figure 4E:
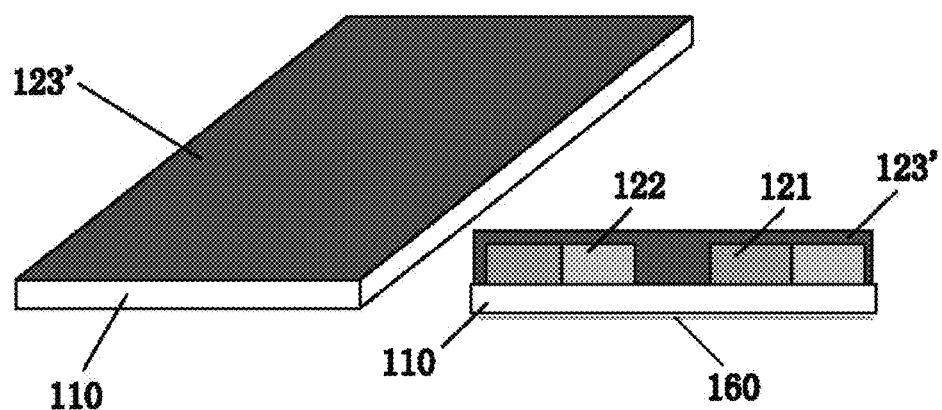
Figure 4F:
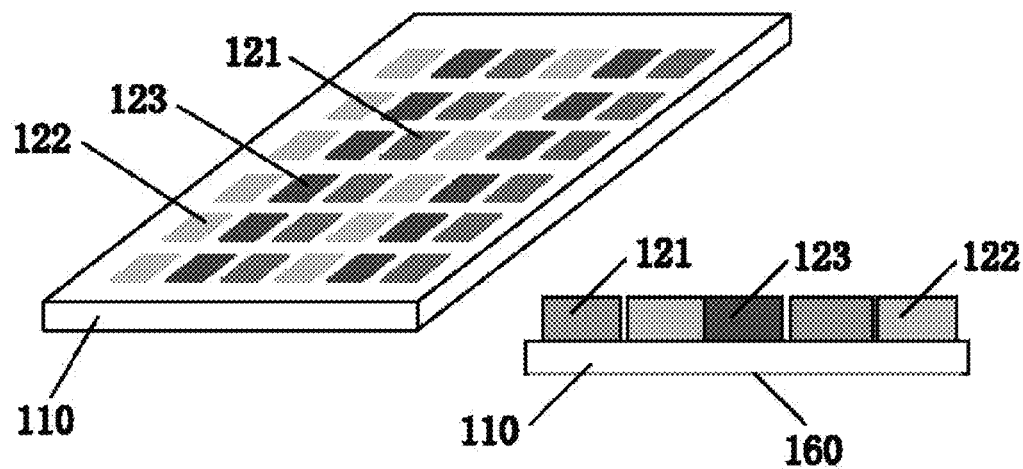

Subsequently, in step S220, the color filter layer is formed on a surface of the base substrate opposite to the surface on which the ITO film is formed. FIGS. 4A-4F show the schematic views of the forming steps of the color filter layer, wherein, FIGS. 4A and 4B show the forming process of the red filter, FIGS. 4C and 4D show the forming process of the green filter, and FIGS. 4E and 4F show the forming process of the blue filter.

Take the red filter as an example, as shown in FIG. 4A, a red filter material coating 121' is coated on the surface of the base substrate 110 opposite to the surface on which the ITO film is formed firstly. Subsequently, a red filter pattern 121 as shown in FIG. 4B is formed through steps of mask covering, exposing and developing etc., wherein an area between two columns of red filters is used for accommodating the green and blue filters to be formed subsequently. The above similar process steps are also applied for the green and blue filters, so as to form the color filter layer 120 on which the red, green and blue filters are arranged staggered as shown in FIG. 4F on the base substrate 110.

It should be noted that the forming order of the filters of the above three colors is only exemplary rather than restrictive.

Figure 5:
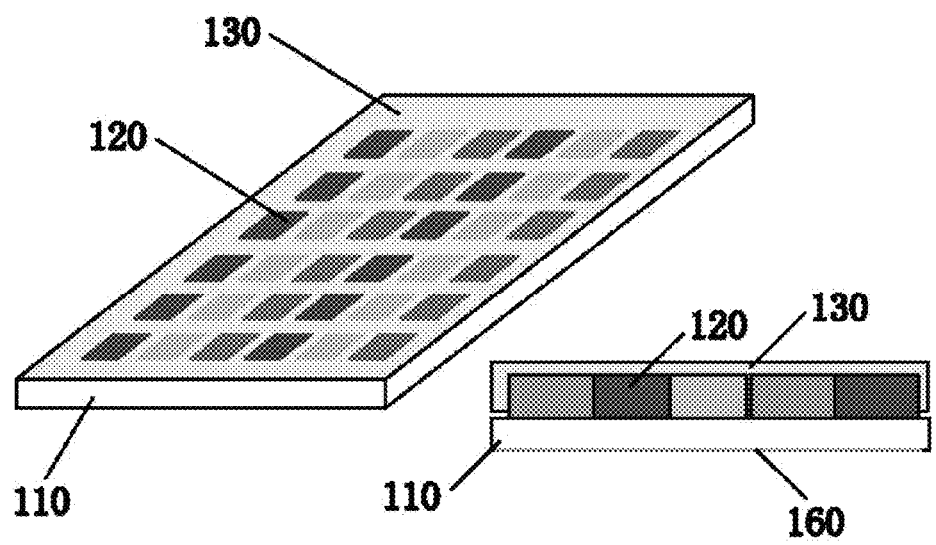
FIG. 5 exemplarily shows a protective layer formed on the color filter layer.

And then, in step S230, the protective layer is formed on the color filter layer 120 as shown in FIG. 4F. FIG. 5 exemplarily shows a protective layer formed on the color filter layer. The forming process of the protective layer is coating a protective film material on the color filter layer 120 firstly, and then heating the protective film material so as to be cured to form the protective layer 130 as shown in FIG. 5.

Subsequently, in step S240, an alignment layer is formed on the protective layer 130 as shown in FIG. 5. Due to optical anisotropy of the liquid crystal material, for example, a rubbing process is further applied to the surface of the alignment layer formed, so as to ensure that the cured liquid crystal layer has the required initial alignment, thereby obtaining a better light shielding effect.

Figure 6A:
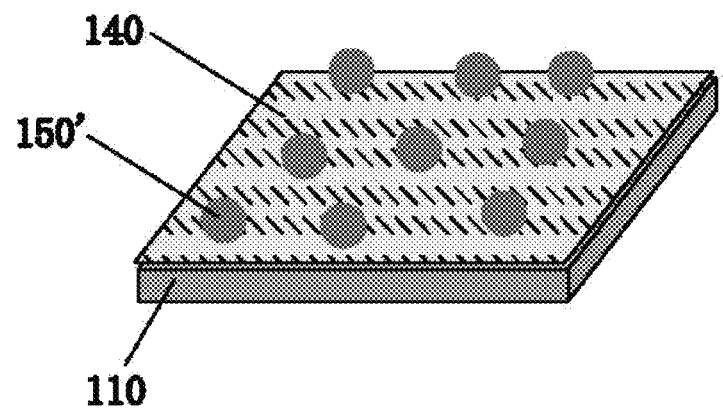
FIGS. 6A and 6B exemplarily show the forming steps of the light shielding layer.
Figure 6B:
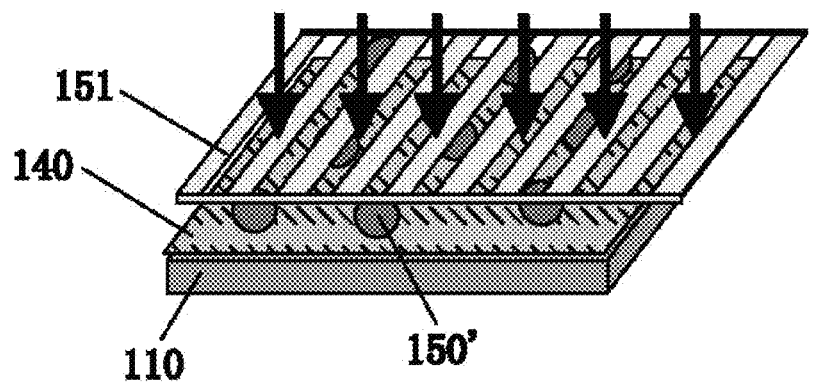

And then, in step S250, a light shielding layer is formed at positions on the alignment layer corresponding to the peripheral areas of the filters. FIGS. 6A and 6B exemplarily show the forming steps of the light shielding layer. As shown in FIG. 6A, a light shielding material mixture 150' in liquid drop shape is coated on the alignment layer 140 firstly, wherein the mixture comprises liquid crystal body, monomer and optical initiator with a mass ratio of 90:8:2 and is heated to liquid crystal clearing temperature. For example, the liquid crystal body in the mixture uses the same material as the liquid crystal layer, wherein the monomer comprises a mixture of hexadecyl methacrylate and methyl methacrylate (MMA) with a mole ratio of 1:1, and the optical initiator comprises azobisisobutyronitrile (AIBN). Due to liquidity factors, the liquid drop shaped mixture will form a coating on the alignment layer 140. Subsequently, the light shielding layer is formed through steps of mask covering, exposing, developing, etc.

The mask plate that covers the mixture has a pattern corresponding to the peripheral areas of the filters. In the exposing step, as shown in FIG. 6B, the mask plate 151 is irradiated using UV light (which is indicated with arrows in the figure), so as to enable the mixture at the positions corresponding to the peripheral areas of the filters to be cured. For example, in the exposing step, the radiation time of the UV light is 30 minutes, and the intensity of light is 4 mw/cm$^2$. In the developing step, the uncured mixture is removed.

Figure 7:
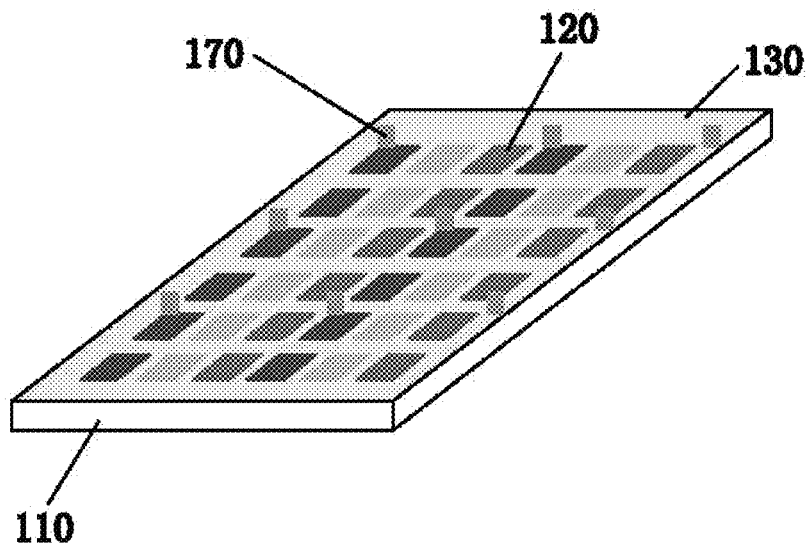
FIG. 7 is a schematic view of a spacer.

Subsequently, in step S260, a spacer is formed on the color film substrate processed via the previous step, so as to enable the color film substrate and the thin film transistor (TFT) cell to be aligned and bonded better. FIG. 7 is a schematic view of a spacer. For example, the spacer 170 as shown in FIG. 7 is formed by coating a spacer material coating on the color film substrate and then through the steps of mask covering, exposing, developing, and so on.

Figure 8:
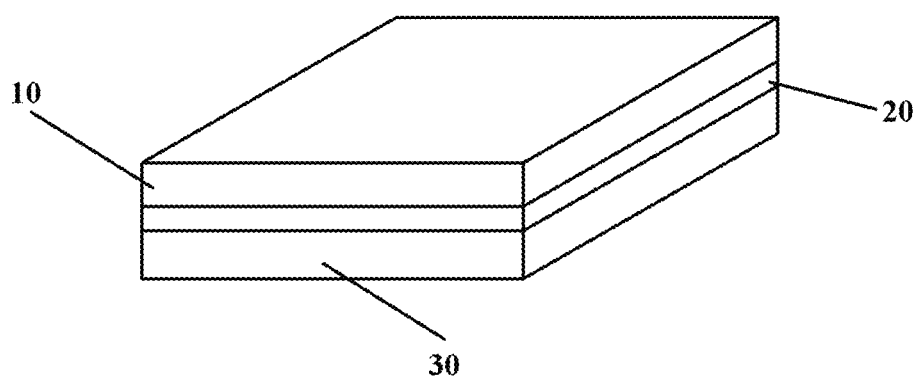
FIG. 8 is a schematic view of a liquid crystal display panel according to another embodiment of the present invention.

FIG. 8 is a schematic view of a display panel according to another embodiment of the present invention.

As shown in FIG. 8, the display panel 1 comprises a color film substrate 10, a liquid crystal layer 20 and an array substrate 30. In this embodiment, the color film substrate 10 uses the above structure in the embodiment described by means of the drawings. The liquid crystal layer is the main body of the LCD display screen, which is located between the color film substrate 10 and the array substrate 30. The function of the array substrate 30 is establishing certain driving conditions by adjusting a series of parameters such as voltage, phase, frequency, peak value, effective value, time sequence, duty ratio applied on the pixel electrode, so as to realize required display.

In addition, an embodiment of the present invention further provides a display device comprising the above display panel. For example, the display device provided by the embodiment of the present invention is any product or component with the display function such as a laptop display, a liquid crystal display, a liquid crystal television, a mobile phone, a panel computer, etc.

Although the exemplary embodiments have been shown and explained, the ordinary skilled person in the art should understand that various modifications can be made to these exemplary embodiments in aspects of form and detail without departing from the spirit and the scope of the concept of the present invention defined by the claims attached.

The invention claimed is:

1. A color film substrate, comprising;
    a base substrate;
    a color filter layer formed on the base substrate, comprising a plurality of adjacently arranged filters;
    a protective layer formed on the color filter layer;
    an alignment layer formed on the protective layer;
    wherein the color film substrate further comprises a light shielding layer formed at positions on the alignment layer corresponding to peripheral areas of the filters;
    wherein a material of the light shielding layer comprises liquid crystal body, monomer and photo initiator.

2. The color film substrate as claimed in claim 1, wherein the light shielding layer corresponding to the peripheral areas of the adjacent filters is formed integrally.

3. The color film substrate as claimed in claim 1, wherein the monomer comprises a mixture of hexadecyl methacrylate and methyl methacrylate with a mole ratio of 1:1.

4. The color film substrate as claimed in claim 1, wherein the photo initiator is azobisisobutyronitrile.

5. A display panel, comprising:
    the color film substrate as claimed in claim 1.

6. A display device, comprising the display panel as claimed in claim 5.

7. The display panel as claimed in claim 5, wherein the light shielding layer corresponding to the peripheral areas of the adjacent filters is formed integrally.

8. The display panel as claimed in claim 5, wherein the monomer comprises a mixture of hexadecyl methacrylate and methyl methacrylate with a mole ratio of 1:1.

9. The display panel as claimed in claim 5, wherein the photo initiator is azobisisobutyronitrile.

10. A manufacturing method of a color film substrate, comprising steps of:
    forming a color filter layer comprising a plurality of filters on a base substrate;
    forming a protective layer on the color filter layer;
    forming an alignment layer on the protective layer;
    forming a light shielding layer at positions on the alignment layer corresponding to peripheral areas of the filters, wherein a material of the light shielding layer comprises liquid crystal body, monomer and photo initiator.

11. The manufacturing method of a color film substrate as claimed in claim 10, wherein, in the step of forming the light shielding layer, the light shielding layer corresponding to the peripheral areas of the adjacent filters is formed integrally.

12. The manufacturing method of a color film substrate as claimed in claim 10, wherein the step of forming a light shielding layer at positions on the alignment layer corresponding to peripheral areas of the filters comprises:
    coating the material on the alignment layer;
    covering the material with a mask plate, the mask plate having a pattern corresponding to the peripheral areas of the filters;
    irradiating the mask plate using UV light, so as to enable the material at the positions corresponding to the peripheral areas of the filters to be cured; and
    removing the uncured material.

13. The manufacturing method of a color film substrate as claimed in claim 12, wherein, prior to coating the material on the alignment layer, a rubbing process is performed to a surface of the alignment layer.

14. The manufacturing method of a color film substrate as claimed in claim 12, wherein, in the step of irradiating the mask plate using UV light, an irradiation time of the UV light is 30 minutes, and an intensity of light is 4 mw/cm$^2$.

15. The manufacturing method of a color film substrate as claimed in claim 10, wherein the monomer comprises a mixture of hexadecyl methacrylate and methyl methacrylate with a mole ratio of 1:1.

16. The manufacturing method of a color film substrate as claimed in claim 10, wherein the photo initiator is azobisisobutyronitrile.

* * * * *